US012784809B2

(12) United States Patent
Si

(10) Patent No.: US 12,784,809 B2
(45) Date of Patent: Nov. 3, 2026

(54) MEMORY AND CONTROL METHOD THEREFOR, AND ELECTRONIC DEVICE

(71) Applicant: CXMT Corporation, Hefei City (CN)

(72) Inventor: Shufang Si, Hefei City (CN)

(73) Assignee: CXMT Corporation, Hefei City (CN)

( * ) Notice: Subject to any disclaimer, the term of this patent is extended or adjusted under 35 U.S.C. 154(b) by 141 days.

(21) Appl. No.: 18/970,679

(22) Filed: Dec. 5, 2024

(65) Prior Publication Data

US 2025/0218496 A1 Jul. 3, 2025

Related U.S. Application Data

(63) Continuation of application No. PCT/CN2024/126301, filed on Oct. 22, 2024.

(30) Foreign Application Priority Data

Dec. 29, 2023 (CN) ........................ 202311869141.2

(51) Int. Cl.
*G11C 11/40* (2006.01)
*G11C 11/408* (2006.01)
*G11C 11/4094* (2006.01)

(52) U.S. Cl.
CPC ...... *G11C 11/4087* (2013.01); *G11C 11/4085* (2013.01); *G11C 11/4094* (2013.01)

(58) Field of Classification Search
CPC ............ G11C 11/4087; G11C 11/4085; G11C 11/4094; G11C 11/4097; G11C 5/063; G11C 7/18; G11C 5/025; G11C 8/12; G11C 7/12; G11C 8/08; H10W 80/00; H10W 90/00; H10B 12/482
See application file for complete search history.

(56) References Cited

U.S. PATENT DOCUMENTS

2012/0033489 A1 2/2012 Song et al.
2013/0336036 A1* 12/2013 Cernea .................. G11C 5/025 365/51
2024/0355364 A1* 10/2024 Chang .................... G11C 5/025

OTHER PUBLICATIONS

Extended European Search Report in application No. 24 861 342.4, mailed on Nov. 28, 2025.

* cited by examiner

*Primary Examiner* — Xiaochun L Chen
(74) *Attorney, Agent, or Firm* — Syncoda LLC; Feng Ma

(57) ABSTRACT

The present disclosure provides a memory and a control method therefor, and an electronic device. In a first chip of the memory, each local bit line is coupled to a common bit line on one side through a respective bit line selector, and each local bit line is coupled to a common bit line on the other side through a respective precharge switch. The bit line selector is configured to receive a sub word line drive signal, and selectively connect a connected local bit line to a connected common bit line based on the sub word line drive signal. The precharge switch is configured to receive a sub word line drive complementary signal, and selectively connect a connected local bit line to a connected common bit line based on the sub word line drive complementary signal.

12 Claims, 12 Drawing Sheets

MEMORY AND CONTROL METHOD THEREFOR, AND ELECTRONIC DEVICE

CROSS-REFERENCE TO RELATED APPLICATIONS

This application is a continuation of International Patent Application No. PCT/CN2024/126301 filed on Oct. 22, 2024, which claims priority to Chinese Patent Application No. 202311869141.2 filed on Dec. 29, 2023. The disclosures of the above-referenced applications are hereby incorporated by reference in their entirety.

BACKGROUND

With development of semiconductor technologies, semiconductor memories are widely applied to electronic apparatuses. A dynamic random access memory (DRAM) belongs to a volatile memory, and the dynamic random access memory is usually utilized as a cache due to a fast access speed.

Two parts, that is, a peripheral circuit (Periphery) and a memory array (Core) are mainly included in the dynamic random access memory. To further increase the storage density, in a three-dimensional DRAM (3D DRAM), the peripheral circuit (Periphery) and the memory array (Core) are respectively disposed in two independent chips, and then the two chips are connected to each other in a bonding manner. In addition, a three-dimensional structure of the memory array is more complex, and therefore additional control logic is required.

SUMMARY

The present disclosure relates to the semiconductor field, and in particular, to a memory and a control method therefor, and an electronic device.

Embodiments of the present disclosure provide a memory and a control method therefor, and an electronic device.

The technical solutions of the present disclosure are implemented as follows.

According to a first aspect, the present disclosure provides a memory. A first chip is included in the memory, multiple memory array tiles are included in the first chip, multiple local bit lines and multiple common bit lines are included in each of the memory array tiles, the local bit lines extend in a first direction, the common bit lines extend in a second direction, one of the common bit lines exists on each of two sides of the local bit lines in the first direction, and the first direction intersects the second direction.

Each of the local bit lines is coupled to the common bit line on one side through a respective bit line selector, and each of the local bit lines is coupled to the common bit line on the other side through a respective precharge switch.

The bit line selector is configured to receive a sub word line drive signal, and selectively connect a connected local bit line to a connected common bit line based on the sub word line drive signal.

The precharge switch is configured to receive a sub word line drive complementary signal, and selectively connect a connected local bit line to a connected common bit line based on the sub word line drive complementary signal; and both the sub word line drive signal and the sub word line drive complementary signal are generated by decoding a row address signal in a command address signal received by the memory.

In some embodiments, multiple sub array tiles sequentially arranged in the second direction are included in each of the memory array tiles, multiple storage regions sequentially stacked in a third direction are included in each of the sub array tiles, and two storage layer groups arranged in the first direction are included in each of the storage regions; and multiple ones of the local bit lines are disposed in each of the storage layer groups, a first common bit line is disposed on the outer side of each of the storage layer groups away from the other one of the storage layer groups in the same one of the storage regions, and a second common bit line is disposed on the inner side of each of the storage layer groups close to the other one of the storage layer groups in the same one of the storage regions.

For each of the storage layer groups, each of the local bit lines is coupled to the second common bit line through the respective bit line selector, and each of the local bit lines is coupled to the first common bit line through the respective precharge switch.

In some embodiments, multiple sub array tiles sequentially arranged in the second direction are included in each of the memory array tiles, multiple storage regions sequentially stacked in a third direction are included in each of the sub array tiles, and two storage layer groups arranged in the first direction are included in each of the storage regions; and multiple ones of the local bit lines are disposed in each of the storage layer groups, a first common bit line is disposed on the outer side of each of the storage layer groups away from the other one of the storage layer groups in the same one of the storage regions, and a second common bit line is disposed on the inner side of each of the storage layer groups close to the other one of the storage layer groups in the same one of the storage regions.

The storage regions are numbered in the third direction for the same one of the sub array tiles.

For an odd-numbered one of the storage regions, each of the local bit lines is coupled to the first common bit line through the respective bit line selector, and each of the local bit lines is coupled to the second common bit line through the respective precharge switch.

For an even-numbered one of the storage regions, each of the local bit lines is coupled to the second common bit line through the respective bit line selector, and each of the local bit lines is coupled to the first common bit line through the respective precharge switch.

In some embodiments, multiple local word lines are further included in the memory array tile, and each of the local word lines runs through multiple stacked storage layer groups in the third direction; and the third direction is perpendicular to the first direction and perpendicular to the second direction.

One sub word line group is formed by multiple ones of the local word lines that are aligned in the first direction and that pass through the same one of the storage layer groups.

One of the local bit lines and one sub word line group have a correspondence, and a memory cell is formed at an intersection of the local bit line and each corresponding one of the local word lines.

All local word lines in the same sub word line group share the same sub word line drive signal and the same sub word line drive complementary signal, the bit line selector of the local bit line receives the sub word line drive signal of a corresponding sub word line group, and the precharge switch of the local bit line receives the sub word line drive complementary signal of the corresponding sub word line group.

In some embodiments, multiple common word lines extending in the second direction are further included in each of the memory array tiles.

The local word lines in each of the sub array tiles are numbered sequentially and independently, and the identically numbered local word lines in different ones of the sub array tiles are electrically connected to the same one of the common word lines, and share the same sub word line drive signal and the same sub word line drive complementary signal.

In some embodiments, in the memory array tiles, the common word lines are sequentially numbered in the first direction, and one main word line group is formed by N consecutively numbered ones of the common word lines.

A decoding unit and multiple sub word line driver units are included in the memory, where N is a positive integer.

The decoding unit is configured to decode the row address signal to generate a main word line drive signal, the sub word line drive signal, and the sub word line drive complementary signal that are of each of the common word lines.

The sub word line driver unit is coupled to one of the common word lines and is configured to: receive, and enable or disable the coupled common word line based on, a corresponding main word line drive signal, a corresponding sub word line drive signal, and a corresponding sub word line drive complementary signal.

The two storage layer groups in each of the storage regions are sequentially referred to as a first storage layer group and a second storage layer group in the first direction, the main word line drive signal is configured to select one main word line group from both the first storage layer group and the second storage layer group, and the sub word line drive signal and the sub word line drive complementary signal are configured to select one of the common word lines from the selected main word line group in the first storage layer group, or select one of the common word lines from the selected main word line group in the second storage layer group.

In some embodiments, a first switching transistor, a second switching transistor, and a third switching transistor are included in the sub word line driver unit.

Control terminals of both the first switching transistor and the second switching transistor receive the main word line drive signal, a first terminal of the first switching transistor receives the sub word line drive signal, a second terminal of the first switching transistor, a first terminal of the second switching transistor, and a first terminal of the third switching transistor are all connected to the common word line, both a second terminal of the second switching transistor and a second terminal of the third switching transistor are connected to a power terminal, and a control terminal of the third switching transistor receives the sub word line drive complementary signal.

In some embodiments, a second chip is further included in the memory, the first chip and the second chip are stacked in the third direction, and the first chip is bonded to the second chip.

A sense amplification region is included in the second chip.

In the first chip, a stair contact structure is disposed between two of the storage layer groups adjacent in the first direction, and the common bit line directly connected to the bit line selector is coupled to the sense amplification region through the stair contact structure.

According to a second aspect, an embodiment of the present disclosure provides a control method for a memory. Multiple memory array tiles are included in a first chip in the memory, multiple local bit lines and multiple common bit lines are included in each of the memory array tiles, each of the local bit lines is coupled to a common bit line on one side through a bit line selector, and each of the local bit lines is coupled to a common bit line on the other side through a respective precharge switch.

The method includes the steps as follows.

A command address signal is received, and a row address signal in the command address signal is decoded to generate multiple main word line drive signals, multiple sub word line drive signals, and multiple sub word line drive complementary signals.

Whether a corresponding bit line selector is to connect a connected local bit line to a connected common bit line is controlled based on each of the sub word line drive signals.

Whether a corresponding precharge switch is to connect a connected local bit line to a connected common bit line is controlled based on each of the sub word line drive complementary signals.

In some embodiments, multiple sub array tiles sequentially arranged in a second direction are included in each of the memory array tiles, multiple storage regions sequentially stacked in a third direction are included in each of the sub array tiles, and two storage layer groups arranged in a first direction are included in each of the storage regions; and multiple ones of the local bit lines are disposed in each of the storage layer groups, and one of the common bit lines is separately disposed on two sides of each of the storage layer groups in the first direction.

Multiple local word lines are further included in the memory array tile, and each of the local word lines runs through multiple stacked storage layer groups in the third direction; one sub word line group is formed by multiple ones of the local word lines that are aligned in the first direction and that pass through the same one of the storage layer groups, and all local word lines in the same sub word line group share the same sub word line drive signal and the same sub word line drive complementary signal; and one of the local bit lines and one sub word line group have a correspondence, and a memory cell is formed at an intersection of the local bit line and each corresponding one of the local word lines.

Each sub word line group has a sub word line drive signal and a sub word line drive complementary signal; and the method further includes the steps as follows.

The sub word line drive signal of the sub word line group is transmitted to the bit line selector of the local bit line corresponding to the sub word line group.

The sub word line drive complementary signal of the sub word line group is transmitted to the precharge switch of the local bit line corresponding to the sub word line group.

In some embodiments, the local word lines in each of the sub array tiles are numbered sequentially and independently, and the identically numbered local word lines in different ones of the sub array tiles are electrically connected to the same one of the common word lines, and share the same sub word line drive signal and the same sub word line drive complementary signal; and in the memory array tiles, the common word lines are numbered in the first direction, and one main word line group is formed by N consecutively numbered ones of the common word lines.

Two storage layer groups in each of the storage regions are sequentially referred to as a first storage layer group and a second storage layer group in the first direction; and the method further includes the steps as follows.

One main word line group is selected from both the first storage layer group and the second storage layer group based on the main word line drive signals.

One of the common word lines is selected from the selected main word line group in the first storage layer group or the selected main word line group in the second storage layer group based on the sub word line drive signal and the sub word line drive complementary signal.

The selected common word line is enabled, and an operation indicated by the command address signal is performed.

According to a third aspect, an embodiment of the present disclosure provides an electronic device, and the memory according to the first aspect is included in the electronic device.

The embodiments of the present disclosure provide the memory and the control method therefor, and the electronic device, to control working states of the precharge switch and the bit line selector of the local bit line based on the sub word line drive signal and the sub word line drive complementary signal generated by decoding the row address signal. Therefore, although the precharge switch and the bit line selector are additionally introduced into a three-dimensional memory, it is unnecessary to additionally introduce control information and redundant decoding logic, thereby improving control efficiency and omitting a redundant component.

DETAILED DESCRIPTION

Figure 1A:
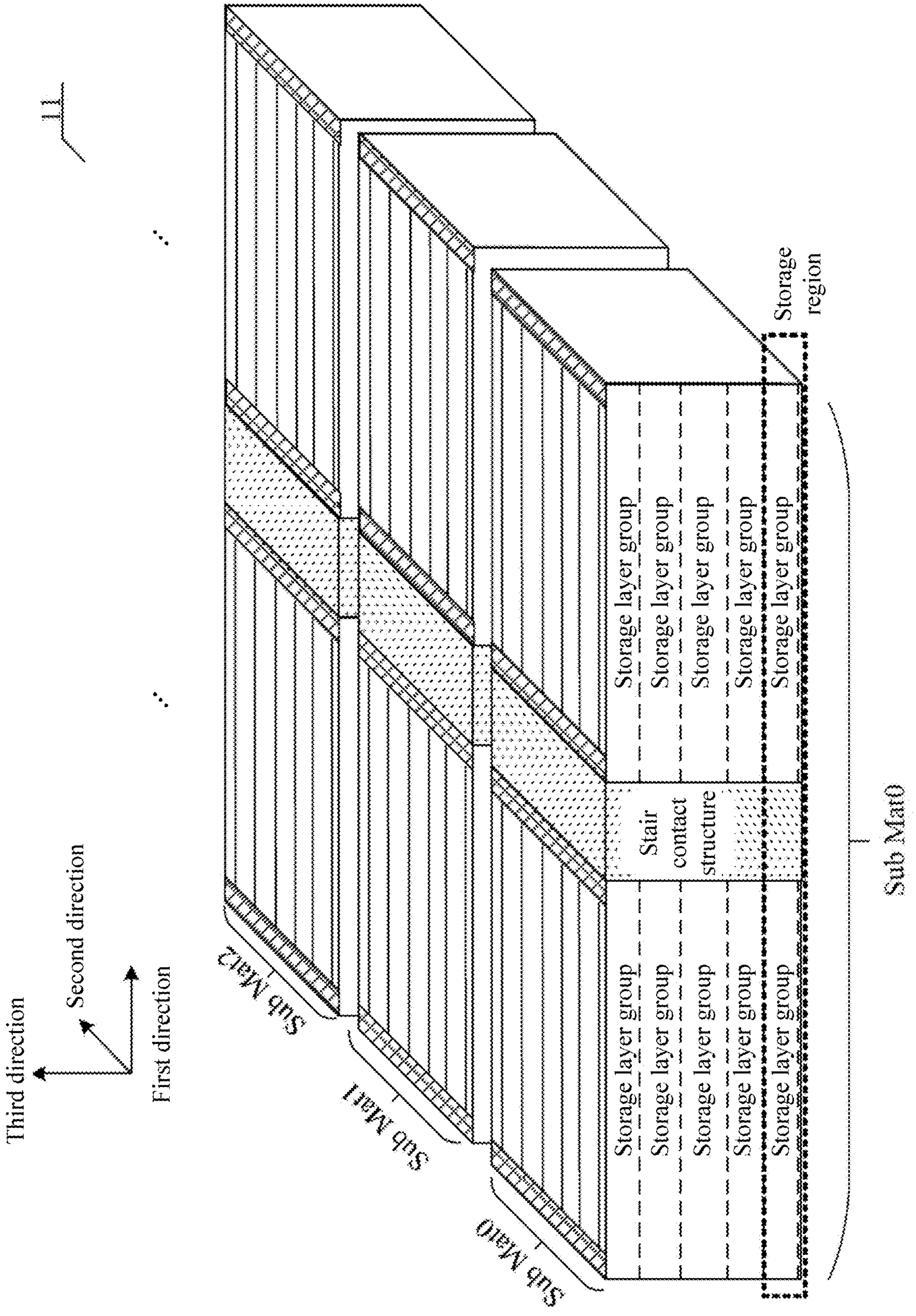
FIG. 1A is a first schematic structural diagram of a memory array tile in a first chip.

To make the objectives, technical solutions, and advantages of the present disclosure clearer, the technical solutions of the present disclosure are further described in detail below with reference to the accompanying drawings and the embodiments. The described embodiments should not be considered as limitations to the present disclosure. All other embodiments obtained by a person of ordinary skill in the art without creative efforts fall within the scope of the present disclosure.

The following descriptions relate to "some embodiments" describing a subset of all possible embodiments. However, it may be understood that "some embodiments" may be the same subset or different subsets of all the possible embodiments, and may be combined with each other when there is no conflict.

The following descriptions are added if descriptions such as "first/second" appear in the application document. In the following descriptions, involved terms "first/second/third" are merely for distinguishing between similar objects and do not represent specific rankings of the objects. It may be understood that "first/second/third" may be interchanged for a specific sequence or order if allowed, so that the embodiments of the present disclosure described herein can be implemented in a sequence other than those shown or described herein.

Unless otherwise defined, all technical and scientific terms employed in this specification have meanings the same as those commonly understood by a person skilled in the technical field of the present disclosure. The terms employed in this specification are merely intended to describe the embodiments of the present disclosure, but are not intended to limit the present disclosure.

Explanations of Nouns:

word line (WL);

bit line (BL);

complementary metal oxide semiconductor (CMOS);

through silicon via (TSV); and memory array tile (MAT).

Before the embodiments of the present disclosure are described, three directions that may be employed to describe three-dimensional structures in planes in the following embodiments are first defined. For example, in a Cartesian coordinate system, the three directions may include a first direction, a second direction, and a third direction.

A semiconductor chip may include a top surface located on the front and a bottom surface located on the back opposite to the front. When flatness of the top surface and the bottom surface is ignored, a direction intersecting with (e.g., perpendicular to) the top surface and the bottom surface of the semiconductor chip is defined as a third direction. In addition, an extension direction of a local bit line in the semiconductor chip is defined as a first direction, an extension direction of a local word line in the semiconductor chip is defined as a second direction, and the first direction intersects the second direction.

A first chip and a second chip stacked in the third direction are included in a 3D DRAM, memory arrays (Core) are distributed in the first chip, and a peripheral control region (Periphery) and a sense amplification region are distributed in the second chip. For the first chip, a large quantity of memory cells are included in the memory array (Core), and the memory cells are further divided into multiple memory array tiles (Mat), so that control and management are better performed.

Figure 1B:
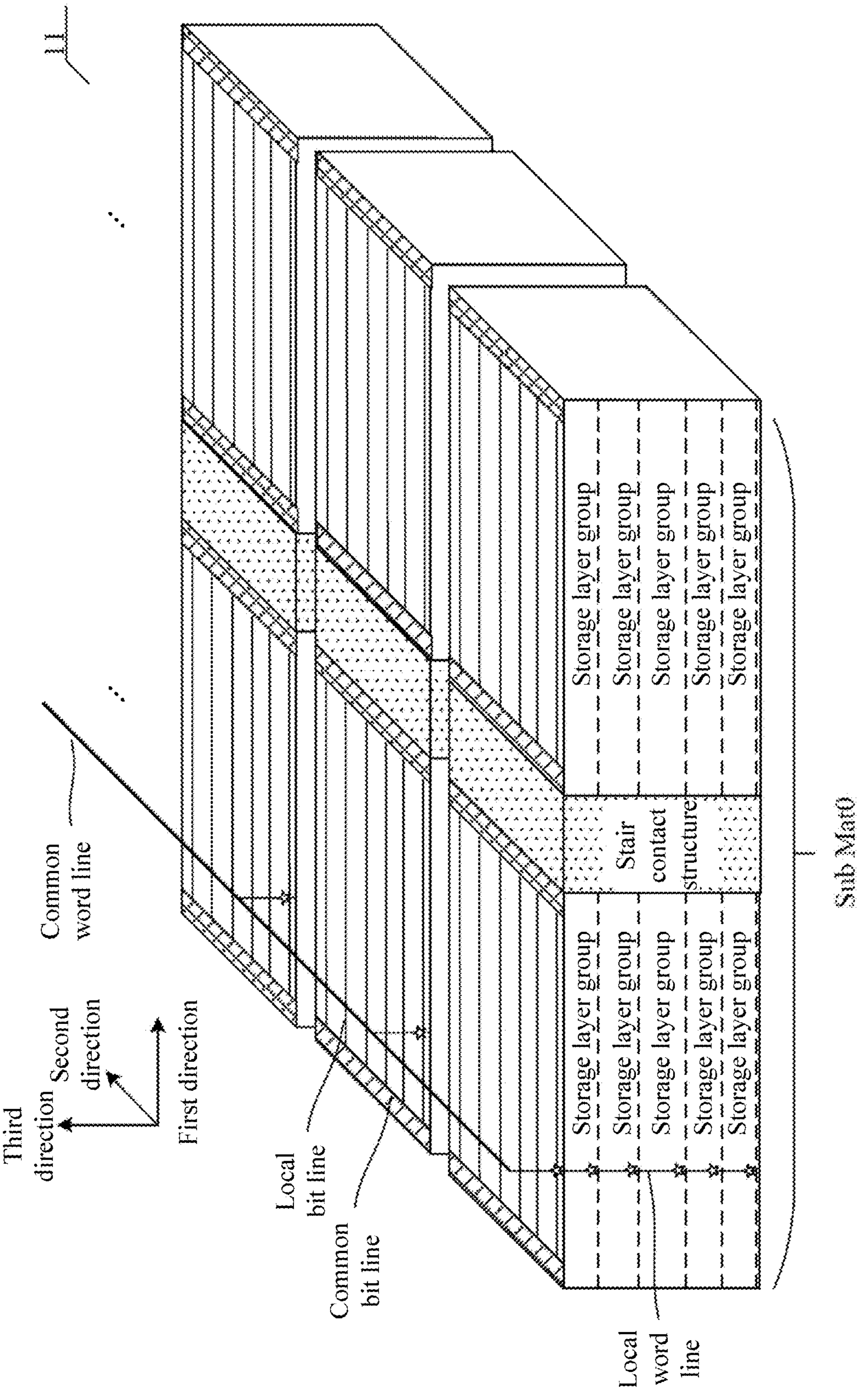
FIG. 1B is a second schematic structural diagram of a memory array tile in a first chip.

FIG. 1A is a schematic structural diagram of a memory array tile 11 in a first chip. As shown in FIG. 1A, multiple sub array tiles Sub Mat0, Sub Mat1, Sub Mat2, and . . . sequentially arranged in the second direction are included in each memory array tile 11. Multiple storage regions sequentially stacked in the third direction are included in each sub array tile. Two storage layer groups arranged in the first direction are included in each storage region, and are respectively referred to as a first storage layer group and a second storage layer group, and a stair contact structure (Staircase) 14 is disposed between the first storage layer group and the second storage layer group. FIG. 1B shows locations of a local bit line Local BL, a common bit line Common BL, a local word line Local WL, and a common word line Common WL. As shown in FIG. 1B, the local word line runs through multiple storage layer groups in the third direction. In each sub array tile, local word lines are numbered in the second direction. In this case, identically numbered local word lines in different sub array tiles are coupled to the same common word line, and the common word line extends in the second direction. In addition, multiple local bit lines extending in the first direction are included in each storage layer group, and one common bit line is separately disposed on the left side and the right side of each storage layer group.

Figure 2:
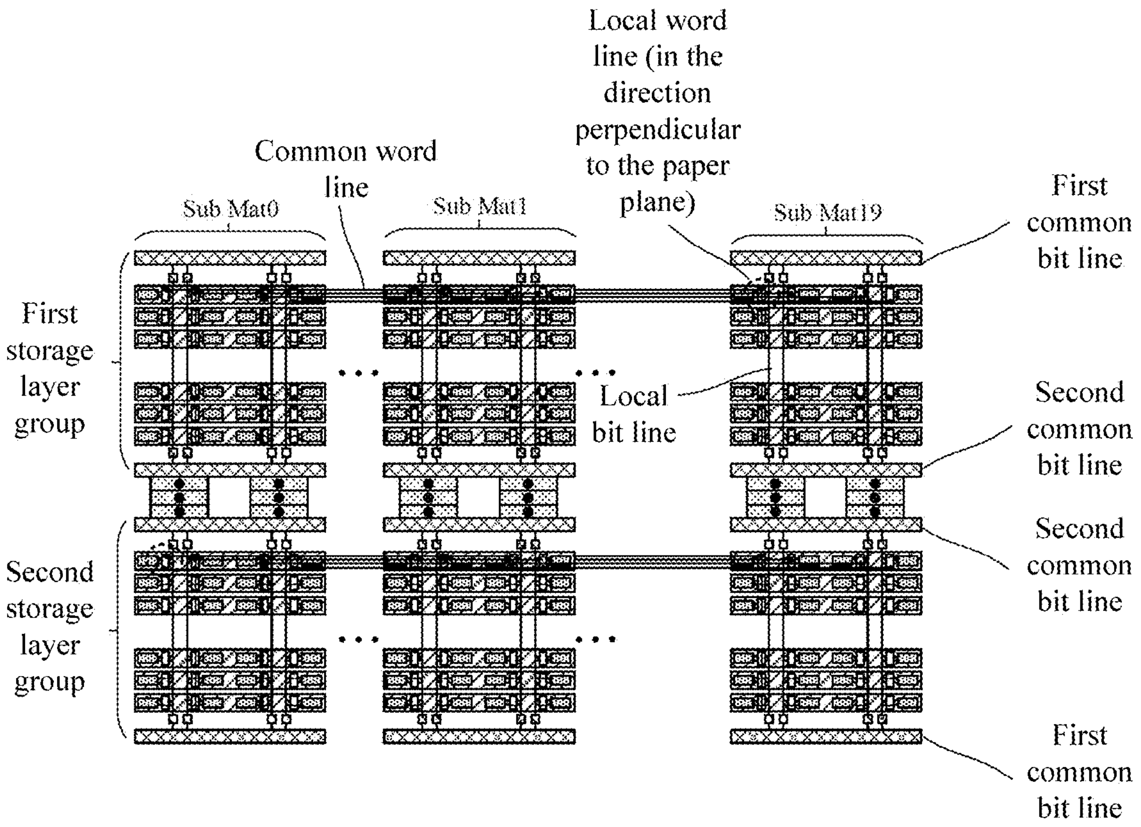
FIG. 2 is a schematic cross-sectional structural diagram of a memory array tile.
Figure 3:
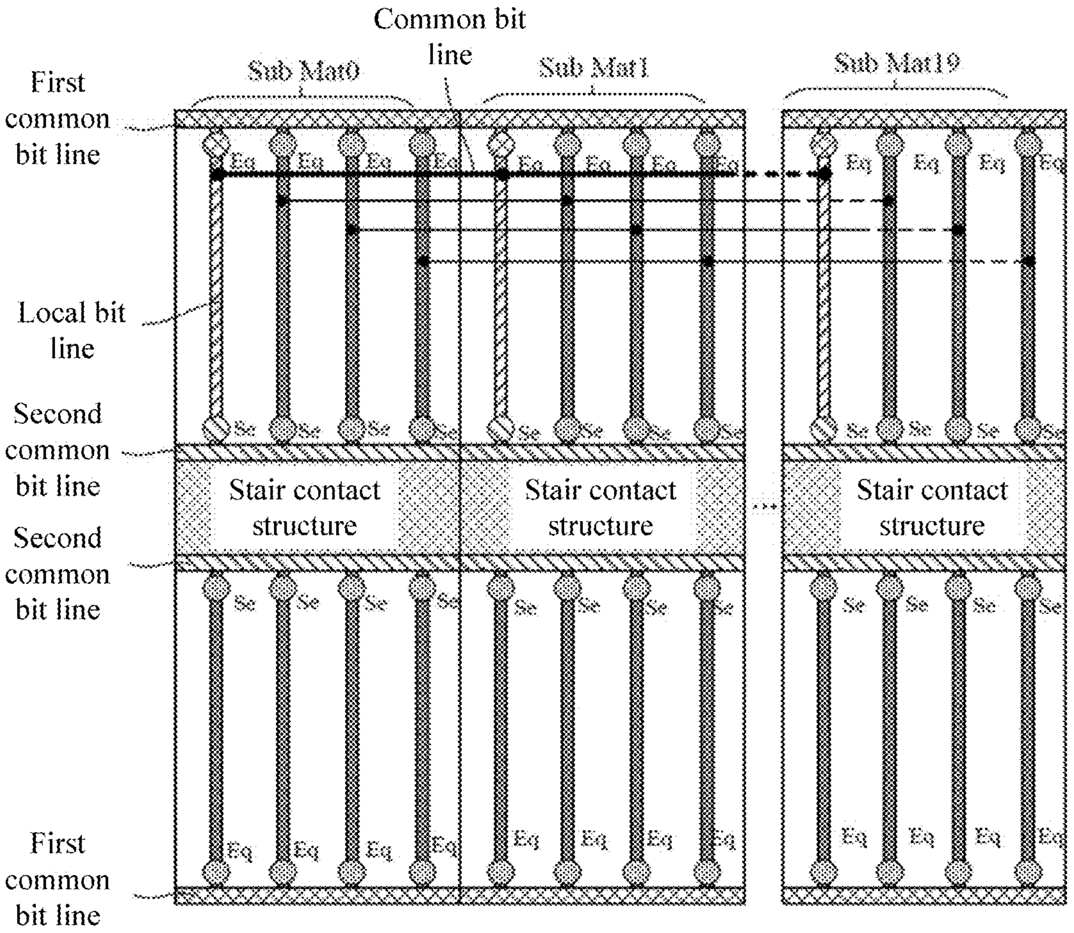
FIG. 3 is a schematic cross-sectional structural diagram of another memory array tile.

FIG. 2 and FIG. 3 are schematic cross-sectional diagrams of memory array tiles in a third direction, in which each memory array tile includes 20 sub array tiles (Sub Mat0, Sub Mat1, . . . , and Sub Mat19). As shown in FIG. 2, a first common bit line is disposed on the outer side (namely, a side away from the other storage layer group in the same storage region) of each storage layer group, and a second common bit line is disposed on the inner side (namely, close to the other storage layer group in the same storage region) of each storage layer group. Referring to FIG. 3, all local bit lines in the storage layer group are connected to the first common bit line through precharge switches Eq, and all the local bit lines in the storage layer group are connected to the second common bit line through bit line selectors Se. The stair contact structure is disposed between the first storage layer group and the second storage layer group, and each second common bit line is coupled to a sense amplifier in the sense amplification region through the stair contact structure.

Data reading is taken as an example. Multiple groups of target memory cells are enabled by opening a common word line, each group of target memory cells are aligned in the third direction, and bit line selectors Se of local bit lines connected to each group of target memory cells are turned on. In this case, each target memory cell is connected to a respective corresponding second common bit line, so that a group of second common bit lines aligned in the third direction share charges with a respective target memory cell, sense amplification is performed, and the second common bit line is at a high potential or a low potential (which depends on data stored in the target memory cell) after the sense amplification. A bit line selector Se of an unselected local bit line is turned off and a precharge switch Eq is turned on, and all first common bit lines are charged to a precharge potential, so that all unselected local bit lines are at the precharge potential. Herein, the precharge potential may be an intermediate potential, and the intermediate potential may be half of a power voltage (Vblh) of a memory array, that is, the intermediate potential=½ Vblh.

In short, for the three-dimensional memory 3D DRAM, local bit lines of the same storage layer group share one first common bit line and the same second common bit line. The bit line selector Se is employed to choose whether to access the second common bit line, and the precharge switch Eq is employed to choose whether to access the first common bit line. Therefore, it is necessary to additionally design a control logic of the bit line selector Se/the precharge switch Eq.

The following describes the embodiments of the present disclosure in detail with reference to the accompanying drawings.

Figure 4:
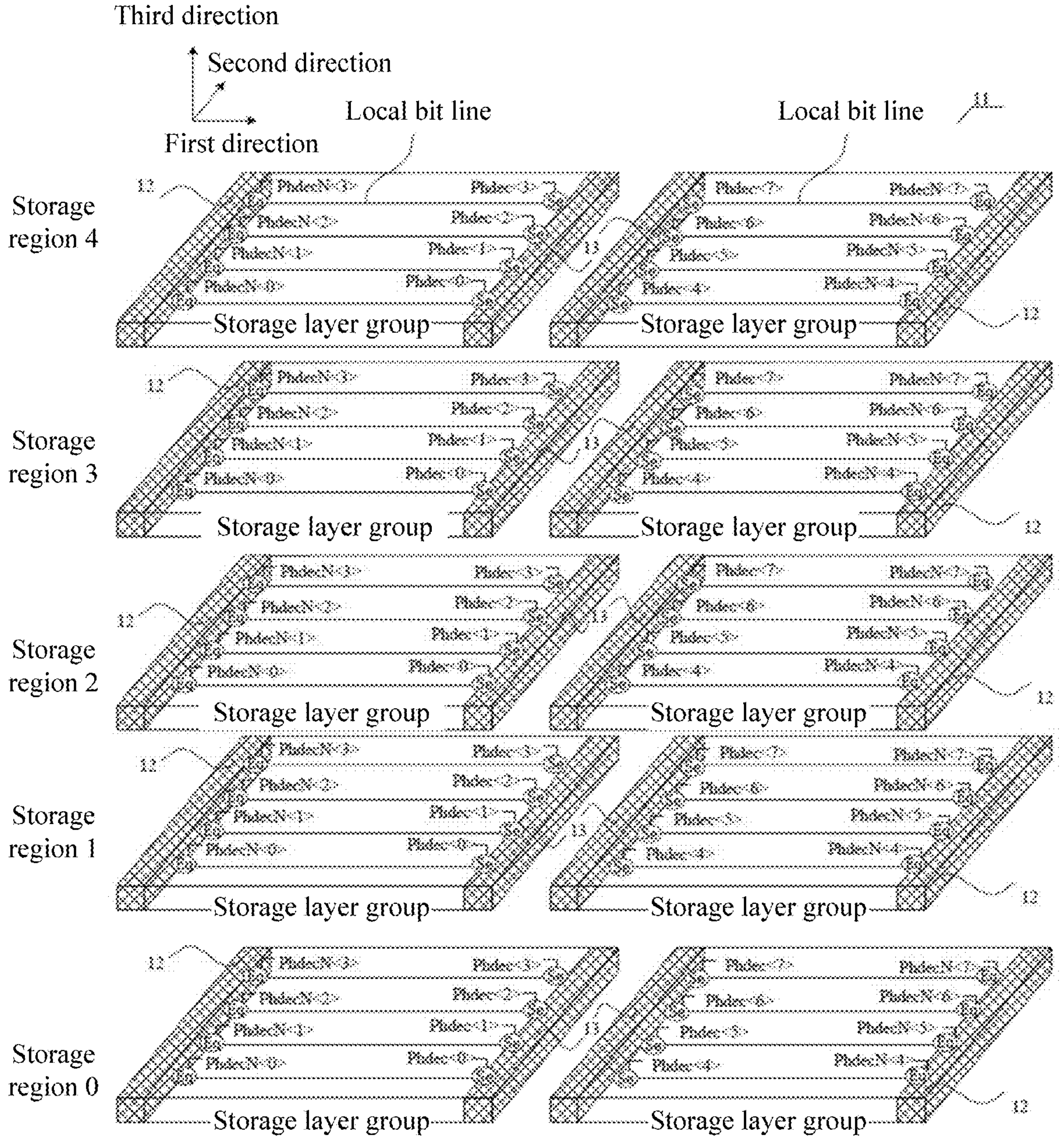
FIG. 4 is a schematic structural diagram 1 of a sub array tile according to an embodiment of the present disclosure.
Figure 5:
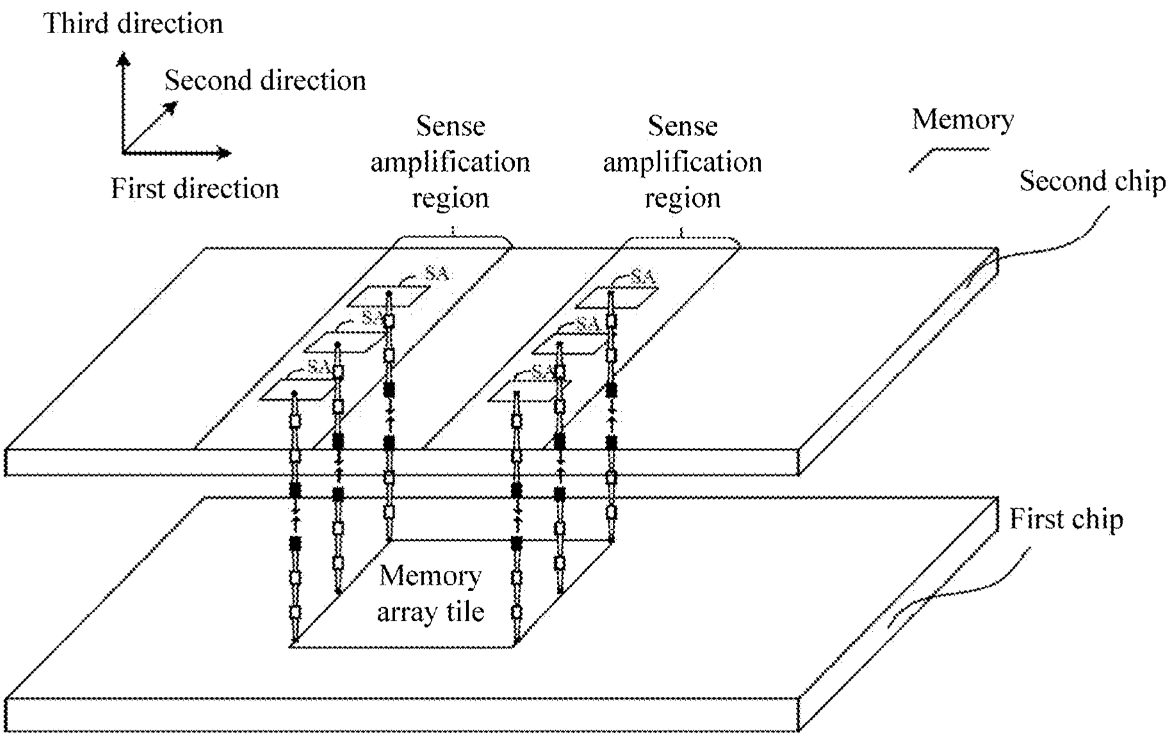
FIG. 5 is a schematic stacked structural diagram of a memory according to an embodiment of the present disclosure.

In an embodiment of the present disclosure, a memory is provided. A first chip is included in the memory, and multiple memory array tiles 11 are included in the first chip. FIG. 4 is a schematic diagram of a partial structure of a memory array tile 11 according to an embodiment of the present disclosure, which is specifically a schematic diagram of a remaining part of a sub array tile (e.g., Sub Mat0, Sub Mat1, and . . . ) in which a stair contact structure is omitted. As shown in FIG. 4, multiple local bit lines and multiple common bit lines (e.g., a first common bit line 12 and a second common bit line 13 in FIG. 4) are included in each memory array tile. The local bit line extends in a first direction, the common bit line extends in a second direction, and one common bit line exists on each of two sides of the local bit line in the first direction. The first direction intersects the second direction.

Each local bit line is coupled to the common bit line on one side through a respective bit line selector Se, and each local bit line is coupled to the common bit line on the other side through a respective precharge switch Eq.

The bit line selector Se is configured to receive a sub word line drive signal Phdec<i> (i is a positive integer), and selectively connect a connected local bit line to a connected common bit line based on the sub word line drive signal.

The precharge switch Eq is configured to receive a sub word line drive complementary signal PhdecN<i> (i is a positive integer), and selectively connect a connected local bit line to a connected common bit line based on the sub word line drive complementary signal.

Herein, both the sub word line drive signal Phdec<i> and the sub word line drive complementary signal PhdecN<i> are generated by decoding a row address signal in a command address signal received by the memory. Generally, the sub word line drive complementary signal PhdecN<i> may be obtained by performing inversion processing on the sub word line drive signal Phdec<i>. In addition, in some embodiments, the sub word line drive complementary signal PhdecN<i> may be obtained by performing inversion processing and delay processing on the sub word line drive signal Phdec<i>, and the sub word line drive signal Phdec<i> and the sub word line drive complementary signal PhdecN<i> are not in a completely strict inversion state.

It should be understood that the row address signal is configured to indicate word line information selected (e.g., enabled) in this operation. To be specific, in this embodiment of the present disclosure, the word line information is reused to control working states of the precharge switch Eq and the bit line selector Se of the local bit line. For a specific principle, refer to subsequent description. Therefore, for a three-dimensional memory, although the precharge switch Eq and the bit line selector Se are additionally introduced, it is unnecessary to additionally introduce control information and redundant decoding logic, thereby improving control efficiency and omitting a redundant component.

It should be noted that FIG. 4 shows that four local bit lines are included in each storage layer group. However, this does not constitute a related limitation.

Referring to FIG. 1A and FIG. 1B, multiple sub array tiles Sub Mat0, Sub Mat1, Sub Mat2, and . . . sequentially arranged in the second direction are included in each memory array tile. Multiple storage regions sequentially stacked in a third direction are included in each sub array tile. Both FIG. 1A and FIG. 1B are shown by taking an example in which five storage regions are included in each sub array tile. However, there may be more storage regions. A first storage layer group and a second storage layer group arranged in the first direction are included in each storage region.

In some embodiments, as shown in FIG. 4, multiple local bit lines are disposed in each storage layer group, a first common bit line 12 is disposed on the outer side of each storage layer group away from the other storage layer group in the same storage region, and a second common bit line 13 is disposed on the inner side of each storage layer group close to the other storage layer group in the same storage region.

For each storage layer group, each local bit line is coupled to the second common bit line 13 through a respective bit line selector Se, and each local bit line is coupled to the first common bit line 12 through a respective precharge switch Eq.

In some embodiments, a second chip is further included in the memory. The first chip and the second chip are stacked in the third direction, and the first chip is bonded to the second chip. A sense amplification region is included in the second chip.

In the first chip, a stair contact structure is disposed between two storage layer groups adjacent in the first direction, and the common bit line directly connected to the bit line selector Se is coupled to the sense amplification region through the stair contact structure.

It should be noted that the first chip is connected to the second chip through bonding. The bonding connection means that two chips are electrically connected through a hybrid bonding (also referred to as a bonding pillar) structure. Hybrid bonding refers to a process of creating permanent bonding between heterogeneous or homogeneous chips. "Hybrid bonding" refers to forming dielectric-dielectric and metal-metal bonding between two surfaces, and has the following advantages: (1) Shorter interconnection distance: No lead is required for interconnection, and no TSV is required for crossing the entire CMOS layer. Interconnection can be implemented simply by a copper contact connected to a rear channel. (2) Higher interconnection density: An area of a copper contact is extremely small. In comparison with a solder ball and a TSV with a diameter of one hundred microns, a spacing size of the copper contact in a hybrid bonding process is even less than 10 microns, which can undoubtedly achieve a higher interconnection density. (3) Lower costs: It undoubtedly takes more time to interconnect each chip individually. A large area of high-density interconnection can be implemented through wafer bonding, which contributes significantly to the improvement of production capacity. Naturally, production costs can be reduced.

It should be noted that multiple sense amplifiers (SA) are included in the sense amplification region, which are also referred to as sensitive amplifiers. By performing sense amplification on an electrical signal of a common bit line connected to a selected memory cell, a potential of the common bit line finally reaches a low potential or a high potential, so that data is read from or written into the selected memory cell.

Herein, a storage structure is formed by vertically stacking multiple layers of memory cells (namely, multiple storage layer groups) in a 3D DRAM. In this case, to ensure that the sense amplifier can be successfully connected to the common bit line in each storage layer group, a 3D stair contact structure (Staircase) needs to be formed. Different stairs of the stair contact structure are electrically isolated, and one stair is correspondingly connected to one common bit line (connected to the bit line selector Se). Further, the common bit line is connected to the sense amplifier SA in the sense amplification region, to implement sense amplification processing.

In this way, the local bit line in each storage layer group is coupled, through the bit line selector Se, to the second common bit line 13 disposed in the middle part of the storage region to which the local bit line belongs, and the stair contact structure is further disposed in the middle part of the storage region. In other words, the second common bit line 13 in each storage layer group can be externally connected to the sense amplifier in the sense amplification region through the stair contact structure disposed in the middle part of the storage region.

Figure 6:
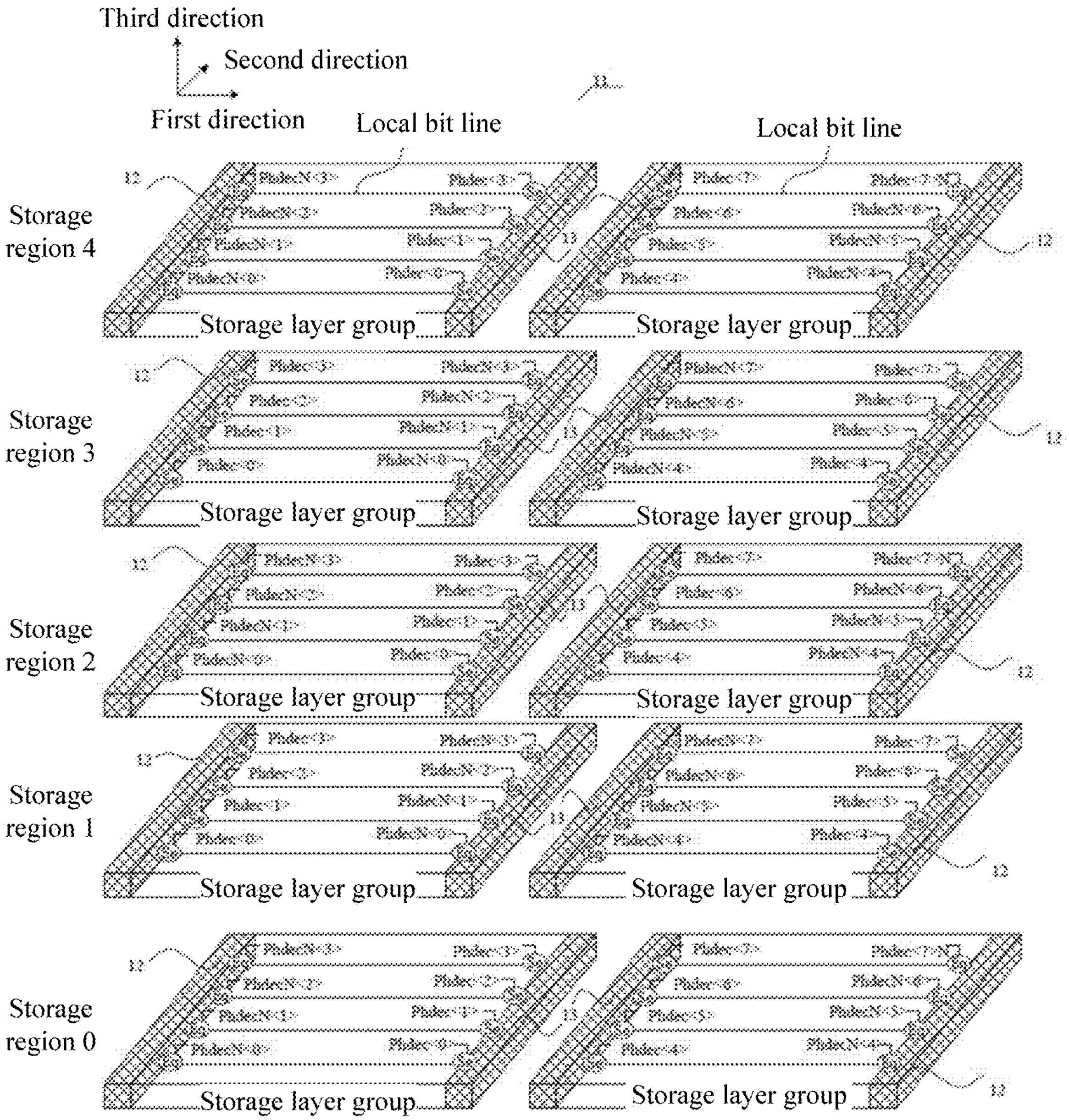
FIG. 6 is a schematic structural diagram 2 of a sub array tile according to an embodiment of the present disclosure.

In some other embodiments, referring to FIG. 6, storage regions are numbered in the third direction for the same sub array tile: a storage region 0, a storage region 1, a storage region 2, a storage region 3, and a storage region 4.

For the odd-numbered storage regions 1 and 3, each local bit line is coupled to the first common bit line 12 through the respective bit line selector Se, and each local bit line is coupled to the second common bit line 13 through the respective precharge switch Eq. For the even-numbered storage regions 0, 2, and 4, each local bit line is coupled to the second common bit line 13 through the respective bit line selector Se, and each local bit line is coupled to the first common bit line 12 through the respective precharge switch Eq.

That is, the first common bit lines 12 of two adjacent storage layer groups are adjacent in the third direction, and the second common bit lines 13 of the two adjacent storage layer groups are adjacent in the third direction, but any first common bit line 12 and any second common bit line 13 are not adjacent in the third direction. In addition, for the odd-numbered storage regions 1 and 3, the local bit line is connected to the first common bit line 12 through the bit line selector Se, and is connected to the second common bit line 13 through the precharge switch Eq. For the even-numbered storage regions 0, 2, and 4, the local bit line is connected to the second common bit line 13 through the bit line selector Se, and is connected to the first common bit line 12 through the precharge switch Eq. Therefore, in a process of sense amplification processing, for multiple selected storage layer groups, for two adjacent first common bit lines 12, it is inevitable that one first common bit line 12 is in a sense amplification state (at a high potential or a low potential after the sense amplification state ends, which depends on a specific data value), and the other first common bit line 12 is at a precharge potential. For two adjacent second common bit lines 13, it is inevitable that one second common bit line 13 is in a sense amplification state (at a high potential or a low potential after the sense amplification state ends, which depends on a specific data value), and the other second common bit line is at a precharge potential, where the low potential<the precharge potential<the high potential. However, sense amplification processing is not simultaneously performed on the two common bit lines adjacent in the third direction, so that the two common bit lines adjacent in the third direction are not simultaneously in the sense amplification state. Therefore, a coupling condition of the two adjacent common bit lines obviously weakens, and sense amplification margin is improved.

Certainly, regardless of changes of locations of the precharge switch Eq and the bit line selector Se, control signals received by the precharge switch Eq and the bit line selector Se are unchanged, so that the sub word line drive complementary signal PhdecN<i> and the sub word line drive signal Phdec<i> generated by the row address signal are still reused for control.

Figure 7:
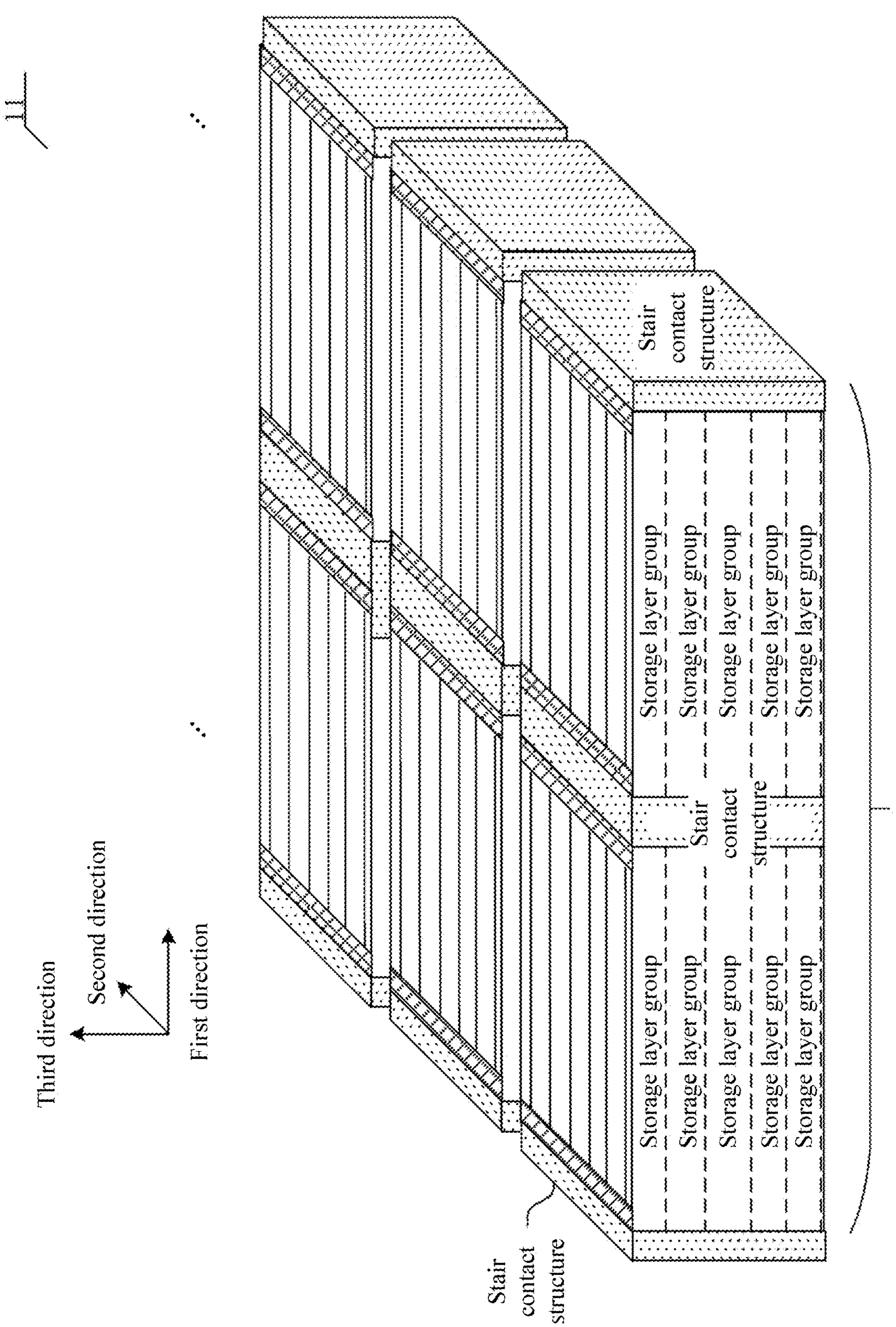
FIG. 7 is a schematic structural diagram of another memory array tile according to an embodiment of the present disclosure.

In addition, referring to FIG. 7, in this case, the stair contact structure is separately located in the middle of each storage region and on the outer side of each storage region. Therefore, for the even-numbered storage regions 0, 2, and 4, the local bit line is connected to the second common bit line 13 on the inner side, and is then coupled to the sense amplifier through the internal stair contact structure. For the odd-numbered storage regions 1 and 3, the local bit line is connected to the first common bit line 12 on the outer side, and is then coupled to the sense amplifier through the external stair contact structure.

In some embodiments, referring to FIG. 1B, multiple local word lines are further included in the memory array tile, each local word line runs through multiple stacked storage layer groups in the third direction, and a memory cell is formed at an intersection of the local bit line and each corresponding local word line. It should be noted that the local bit line and the local word line are not directly connected. For example, the memory cell is of a 1T1C structure, which includes one transistor and one capacitor. The gate of the transistor is connected to the local word line, and the source and the drain of the transistor are respectively connected to the local bit line and the capacitor. The third direction is perpendicular to the first direction and perpendicular to the second direction.

Figure 8A:
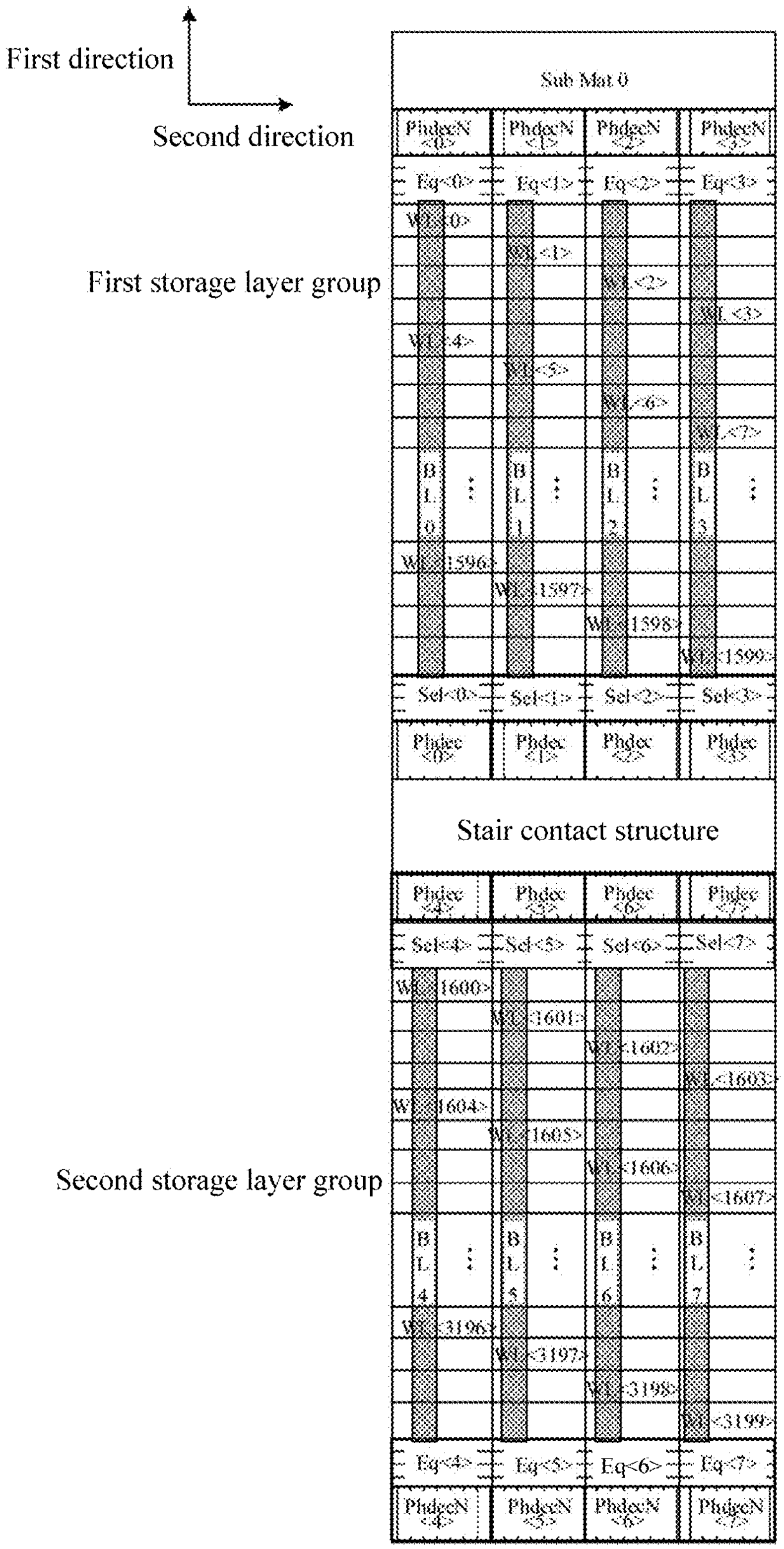
FIG. 8A is a first schematic cross-sectional structural diagram of a memory array tile according to an embodiment of the present disclosure.

FIG. 8A shows control logic of a local word line and a local bit line by taking a cross section of a sub array tile Sub Mat0 in a third direction as an example. As shown in FIG. 8A, one sub word line group is formed by multiple local word lines that are aligned in the first direction and that pass through the same storage layer group. All local word lines in the same sub word line group share the same sub word line drive signal and the same sub word line drive complementary signal.

For example, for a first storage layer group, one sub word line group is formed by local word lines WL<0>, WL<4>, . . . , WL<1592>, and WL<1596>, and the sub word line group shares Phdec<0> and PhdecN<0>. One sub word line group is formed by local word lines WL<1>, WL<5>, . . . , WL<1593>, and WL<1597>, and the sub word line group shares Phdec<1> and PhdecN<1>. One sub word line group is formed by local word lines WL<2>, WL<6>, . . . , WL<1594>, and WL<1598>, and the sub word line group shares Phdec<2> and PhdecN<2>. One sub word line group is formed by local word lines WL<3>, WL<7>, . . . , WL<1595>, and WL<1599>, and the sub word line group shares Phdec<3> and PhdecN<3>.

For a second storage layer group, one sub word line group is formed by local word lines WL<1600>, WL<1604>, . . . , WL<3192>, and WL<3196>, and the sub word line group shares Phdec<4> and PhdecN<4>. One sub word line group is formed by local word lines WL<1601>, WL<1605>, . . . , WL<3193>, and WL<3197>, and the sub word line group shares Phdec<5> and PhdecN<5>. One sub word line group is formed by local word lines WL<1602>, WL<1606>, . . . , WL<3194>, and WL<3198>, and the sub word line group shares Phdec<6> and PhdecN<6>. One sub word line group is formed by local word lines WL<1603>, WL<1607>, . . . , WL<3195>, and WL<3199>, and the sub word line group shares Phdec<7> and PhdecN<7>.

One local bit line and one sub word line group have a correspondence, and a memory cell is formed at an intersection of the local bit line and each corresponding local word line. For example, a local bit line BL0 corresponds to local word lines WL<0>, WL<4>, . . . , WL<1592>, and WL<1596>, and there is a memory cell at an intersection of the local bit line BL0 and the local word line WL<0>, there is a memory cell at an intersection of the local bit line BL0 and WL<4>, . . . , and there is a memory cell at an intersection of the local bit line BL0 and WL<1596>.

The bit line selector Se of the local bit line receives a sub word line drive signal of a corresponding sub word line group, and the precharge switch Eq of the local bit line receives a sub word line drive complementary signal of the corresponding sub word line group, e.g., a control signal of the bit line selector Se of the local bit line BL0 being Sel<0>=Phdec<0> and a control signal of the precharge switch Eq of the local bit line BL0 being Eq<0>=PhdecN<0>.

Figure 8B:
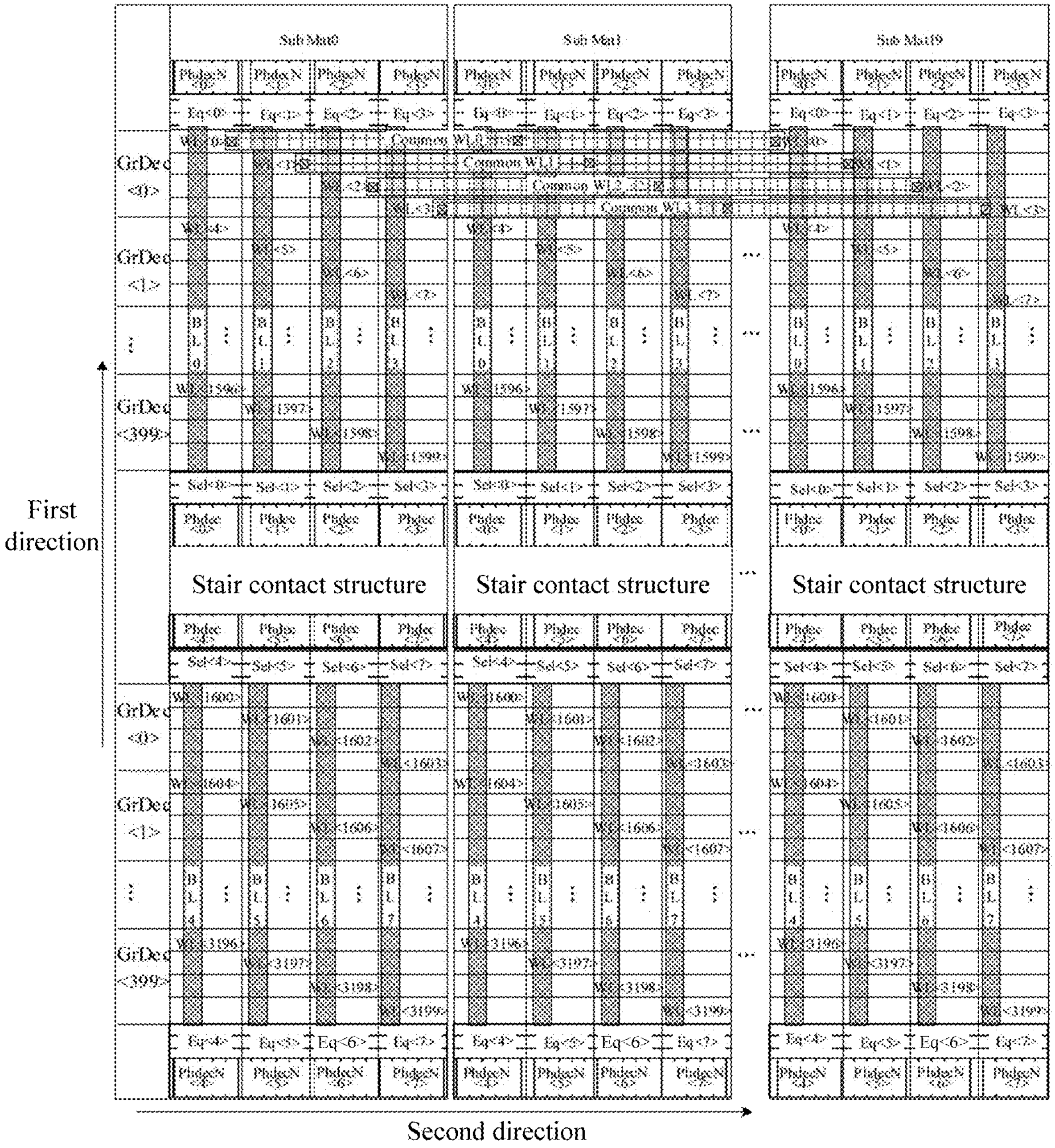
FIG. 8B is a second schematic cross-sectional structural diagram of a memory array tile according to an embodiment of the present disclosure.

In some embodiments, as shown in FIG. 8B, multiple common word lines Common WL extending in the second direction are further included in each memory array tile. The local word lines in each sub array tile are numbered sequentially and independently, and the identically numbered local word lines in different sub array tiles are electrically connected to the same common word line, and share the same sub word line drive signal and the same sub word line drive complementary signal.

In other words, local word lines WL<0>, WL<4>, . . . , and WL<1596> in each of sub array tiles Sub Mat0, Sub Mat1, . . . , and Sub Mat19 share the sub word line drive signal Phdec<0> and the sub word line drive complementary signal PhdecN <0>.

Specifically, the local word line WL<0> in each of the sub array tiles Sub Mat0, Sub Mat1, . . . , and Sub Mat19 is connected to a common bit line Common WL0, the local word line WL<4> in each of the sub array tiles Sub Mat0, Sub Mat1, . . . , and Sub Mat19 is connected to a common bit line Common WL4, . . . , and the local word line WL<1596> in each of the sub array tiles Sub Mat0, Sub Mat1, . . . , and Sub Mat19 is connected to a common bit line Common WL1596. However, the common bit lines Common WL0, Common WL4, . . . , and Common WL1596 share the sub word line drive signal Phdec<0> and the sub word line drive complementary signal PhdecN<0>.

In addition, the bit line selector Se of the first local bit line BL0 in each storage region in each sub array tile receives the sub word line drive signal Phdec<0>, and the precharge switch Eq of the local bit line BL0 in each storage region in each sub array tile receives the sub word line drive complementary signal PhdecN<0>.

Figure 9:
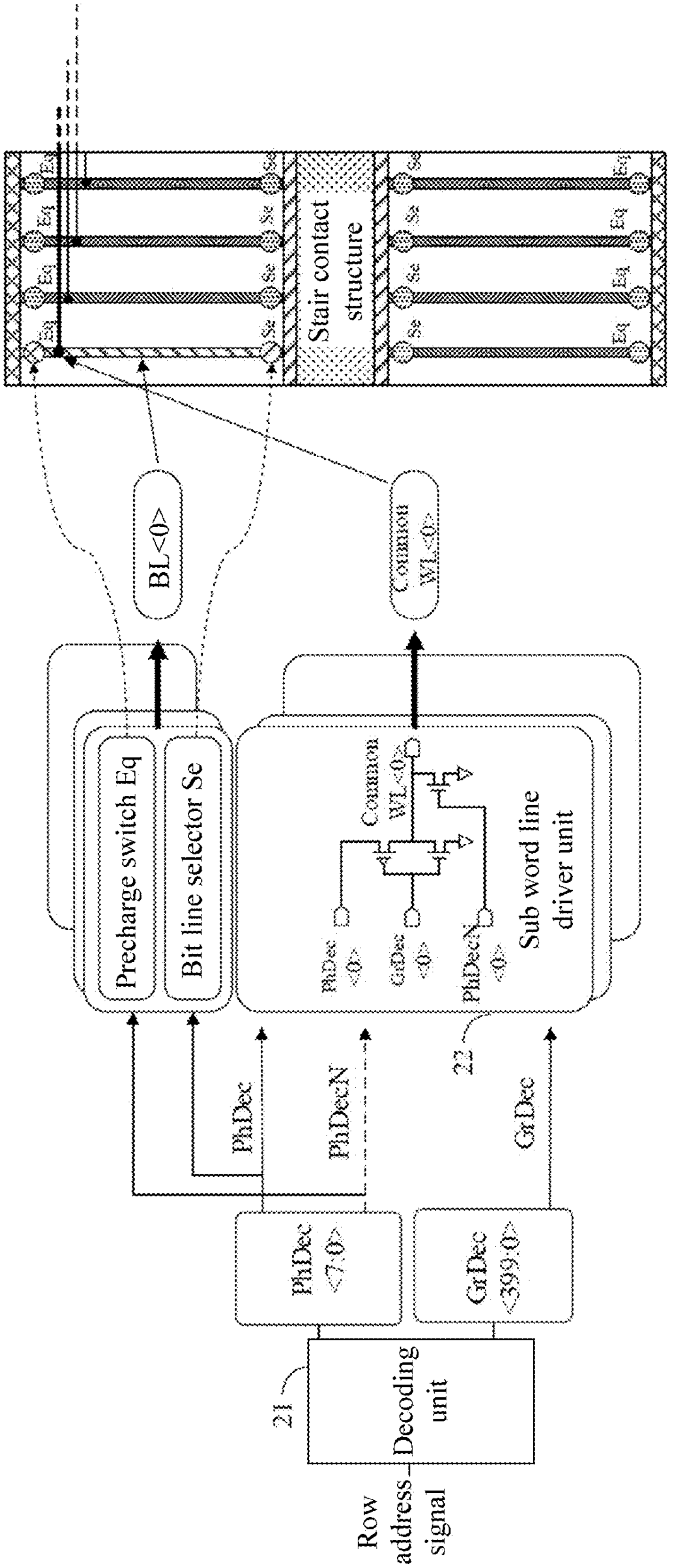
FIG. 9 is a schematic structural diagram of a circuit of a first chip according to an embodiment of the present disclosure.

In some embodiments, as shown in FIG. 8B, in the memory array tile, the common word lines are sequentially numbered in the first direction, and one main word line group is formed by N consecutively numbered common word lines. FIG. 8B is shown by taking N=4 as an example, that is, WL<0> to WL<3> are one main word line group, WL<4> to WL<7> are one main word line group, and Referring to FIG. 9, a decoding unit 21 and multiple sub word line driver units 22 are included in the memory, where N is a positive integer.

The decoding unit 21 is configured to decode the row address signal to generate main word line drive signals, namely, GrDec<399:0>, sub word line drive signals Phdec<7:0>, and sub word line drive complementary signals PhdecN<7:0> that are of each common word line.

The sub word line driver unit 22 is coupled to one common word line, and is configured to: receive, and enable or disable the coupled common word line based on, a corresponding main word line drive signal, a corresponding sub word line drive signal, and a corresponding sub word line drive complementary signal.

The main word line drive signal is configured to select one main word line group from both the first storage layer group and the second storage layer group, and the sub word line drive signal and the sub word line drive complementary signal are configured to select one common word line from the selected main word line group in the first storage layer group, or select one common word line from the selected main word line group in the second storage layer group.

For example, it is assumed that the main word line drive signals GrDec<0>=0, and GrDec<1> to GrDec<399>=1 (it indicates "selected" when the main word line drive signal is at a low level, and it indicates "not selected" when the main word line drive signal is at a high level), the sub word line drive signals Phdec<0>=1, and Phdec<1> to Phdec<7>=0, and the sub word line drive complementary signals PhdecN<0>=0, and PhdecN<1> to PhdecN<7>=1. In this case, the common bit line Common WL<0> is selected, that is, WL<0> in each of the sub array tiles Sub Mat0, Sub Mat1, . . . , and Sub Mat19 is selected (enabled). In addition, for each storage region of each of the sub array tiles Sub Mat0, Sub Mat1, . . . , and Sub Mat19 (because FIG. 8B is a schematic cross-sectional diagram, that is, only a schematic diagram of one storage region of each of the sub array tiles Sub Mat0, Sub Mat1, . . . , and Sub Mat19), the bit line selector Se of the local bit line BL0 is turned on (a control signal thereof being Sel<0>=Phdec<0>=1) and the precharge switch Eq is turned off (a control signal thereof being Eq<0>=PhdecN<0>=0), and the bit line selectors Se of the local bit lines BL1 to BL4 are turned off and the precharge switches Eq are turned on. In this way, because the common bit line Common WL<0> is enabled, BL0 is connected to an adjacent common bit line through the bit line selector Se, and the common bit line is coupled to the sense amplifier through the stair contact structure, a memory cell formed at an intersection of each WL<0> and BL0 shares charges with a corresponding common bit line (through BL0 and the bit line selector Se), and the potential of the common bit line is amplified under the action of the sense amplifier. In addition, WL<1> to WL<4> are not enabled. BL1 to BL4 are connected to adjacent common bit lines through the precharge switch Eq, and the common bit line is controlled at the precharge potential. The precharge potential may be the intermediate potential ½ Vblh, and Vblh is the power potential of the memory array (or the sense amplifier).

Figure 10:
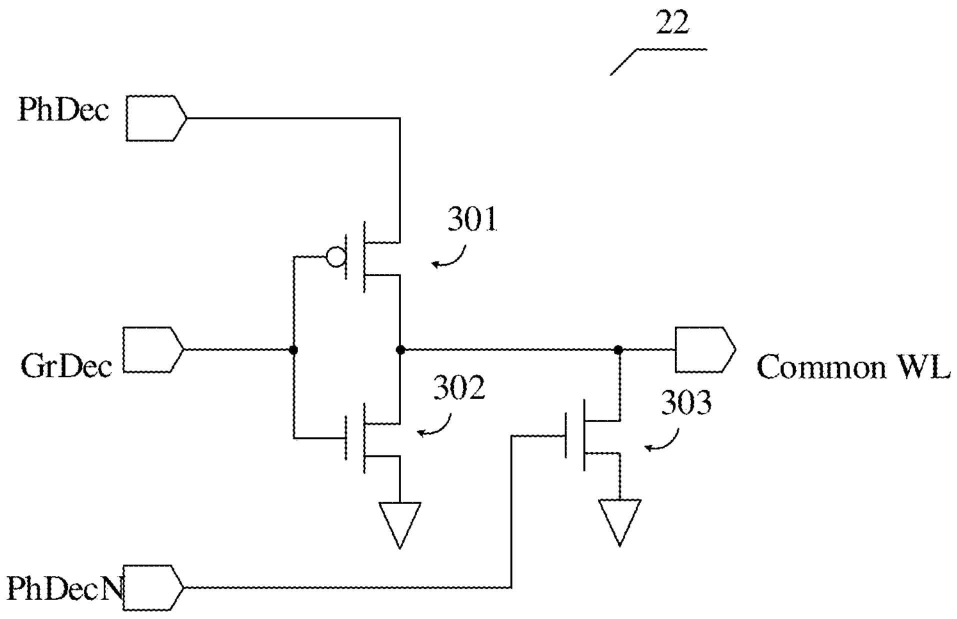
FIG. 10 is a schematic structural diagram of a sub word line driver unit according to an embodiment of the present disclosure.

In some embodiments, referring to FIG. 10, a first switching transistor 301, a second switching transistor 302, and a third switching transistor 303 are included in the sub word line driver unit 22.

Control terminals of both the first switching transistor 301 and the second switching transistor 302 receive the main word line drive signal Grdec, a first terminal of the first switching transistor 301 receives the sub word line drive signal Phdec, a second terminal of the first switching transistor 301, a first terminal of the second switching transistor 302, and a first terminal of the third switching transistor 303 are all connected to the common word line Common WL, both a second terminal of the second switching transistor 302 and a second terminal of the third switching transistor 303 are connected to a power terminal, and a control terminal of the third switching transistor 303 receives the sub word line drive complementary signal PhdecN.

It should be noted that the power terminal may be a ground terminal, the first switching transistor 301 is P-type doped, and both the second switching transistor 302 and the third switching transistor 303 are N-type doped.

In this way, in a case, if Grdec=0, it indicates that a main word line group in which the common word line is located is selected, and the first switching transistor 301 is turned on. If Phdec=1, it indicates that the common word line is selected, and in this case, the common word line Common WL is at a high level (namely, selected/enabled), and a transistor in a connected memory cell is enabled. In another case, if Grdec=0 and Phdec=0, it indicates that although the main word line group in which the common word line is located is selected, the common word line is not selected, the common word line Common WL is at a low level, and the transistor in the connected memory cell is not enabled. In still another case, if Grdec=1, it indicates that the entire main word line group in which the common word line is located is not selected, the first switching transistor 301 is not turned on, the common word line Common WL is at a low level, and the transistor in the connected memory cell is not enabled.

In addition, the third switching transistor 303 is configured to quickly disable a corresponding common word line after the common word line is selected and a corresponding operation is performed.

In conclusion, this embodiment of the present disclosure provides the three-dimensional memory. The first chip and the second chip are included in the three-dimensional memory. The first chip and the second chip are stacked in the third direction, and are connected in a hybrid bonding manner. The first chip is mainly utilized to manufacture the memory array (Core), which is specifically divided into multiple memory array tiles (Mat) for better control and management. The second chip is mainly utilized to manufacture the peripheral control region (Periphery), the sense amplification region, and the like. In the first chip, multiple sub array tiles sequentially arranged in the second direction are included in each memory array tile, multiple storage regions sequentially stacked in the third direction are included in each sub array tile, and two storage layer groups arranged in the first direction are included in each storage region. Multiple local bit lines are included in each storage layer group, one common bit line is separately disposed on the two sides of each storage layer group in the first direction, each local bit line is coupled to the common bit line on one side through the respective bit line selector, and each local bit line is coupled to the common bit line on the other side through the respective precharge switch. In addition, the bit line selector works based on the sub word line drive signal, and the precharge switch works based on the sub word line drive complementary signal. In this way, the word line information is reused in this embodiment of the present disclosure to control the working states of the precharge switch Eq and the bit line selector Se of the local bit line. Therefore, although the precharge switch Eq and the bit line selector Se are additionally introduced into the three-dimensional memory, it is unnecessary to additionally introduce control information and redundant decoding logic, thereby improving control efficiency and omitting a redundant component.

Figure 11:
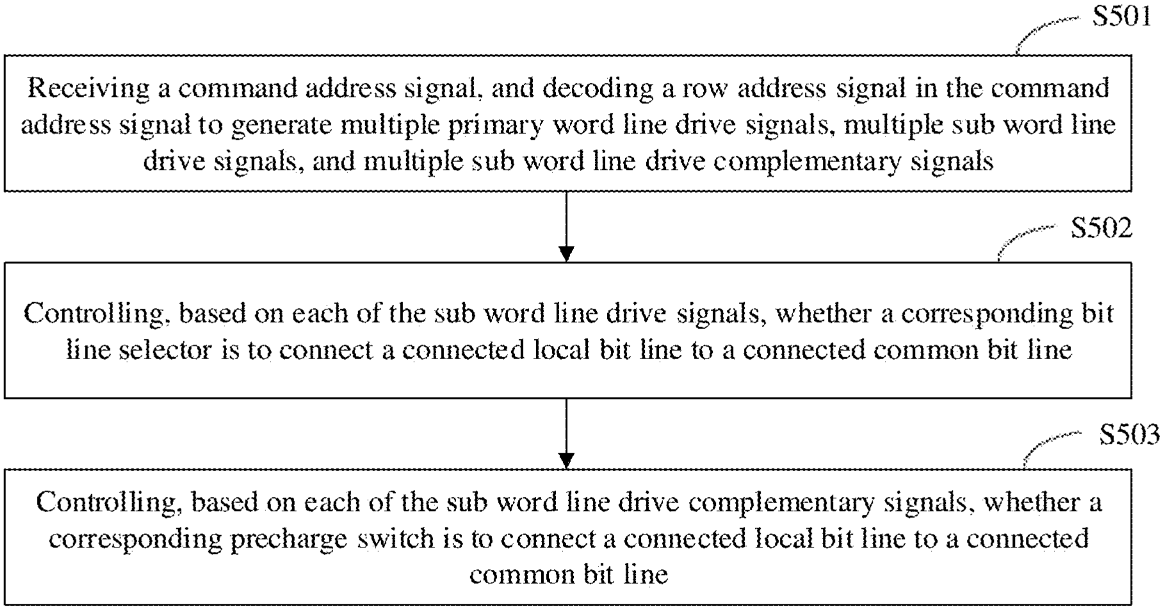
FIG. 11 is a schematic flowchart of a control method according to an embodiment of the present disclosure.

In another embodiment of the present disclosure, reference is made to FIG. 11, which is a schematic flowchart of a control method for a memory according to an embodiment of the present disclosure. The control method is applied to the foregoing memory. Referring to FIG. 1A, a first chip and a second chip stacked in a first direction are included in the memory, multiple memory array tiles are included in the first chip, multiple sub array tiles sequentially arranged in a second direction are included in each memory array tile, multiple storage regions sequentially stacked in a third direction are included in each sub array tile, and two storage layer groups arranged in the first direction are included in each storage region. Multiple local bit lines are included in each storage layer group, one common bit line is separately disposed on two sides of each storage layer group in the first direction, each local bit line is coupled to a common bit line on one side through a respective bit line selector, and each local bit line is coupled to a common bit line on the other side through a respective precharge switch.

As shown in FIG. 11, the method includes the steps as follows.

In S501, a command address signal is received, and a row address signal in the command address signal is decoded to generate multiple main word line drive signals, multiple sub word line drive signals, and multiple sub word line drive complementary signals.

In S502, whether a corresponding bit line selector is to connect a connected local bit line to a connected common bit line is controlled based on each sub word line drive signal.

In S503, whether a corresponding precharge switch is to connect a connected local bit line to a connected common bit line is controlled based on each sub word line drive complementary signal.

In some embodiments, referring to FIG. 8B, multiple local word lines are further included in the memory array tile, and each of the local word lines runs through multiple stacked storage layer groups in the third direction; one sub word line group is formed by multiple local word lines that are aligned in the first direction and that pass through the same storage layer group, and all local word lines in the same sub word line group share the same sub word line drive signal and the same sub word line drive complementary signal; and one local bit line and one sub word line group have a correspondence, and a memory cell is formed at an intersection of the local bit line and each corresponding local word line.

Each sub word line group has a sub word line drive signal and a sub word line drive complementary signal; and the method further includes the steps as follows.

The sub word line drive signal of the sub word line group is transmitted to the bit line selector of the local bit line corresponding to the sub word line group.

The sub word line drive complementary signal of the sub word line group is transmitted to the precharge switch of the local bit line corresponding to the sub word line group.

In some embodiments, the local word lines in each sub array tile are numbered sequentially and independently, and the identically numbered local word lines in different sub array tiles are electrically connected to the same common word line, and share the same sub word line drive signal and the same sub word line drive complementary signal; and in the memory array tiles, the common word lines are numbered in the first direction, and one main word line group is formed by N consecutively numbered common word lines.

Two storage layer groups in each of the storage regions are sequentially referred to as a first storage layer group and a second storage layer group in the first direction; and the method further includes the steps as follows.

One main word line group is selected from both the first storage layer group and the second storage layer group based on the main word line drive signals.

One common word line is selected from the selected main word line group in the first storage layer group or the selected main word line group in the second storage layer group based on the sub word line drive signal and the sub word line drive complementary signal.

The selected common word line is enabled, and an operation indicated by the command address signal is performed.

In this way, word line information is reused in this embodiment of the present disclosure to control working states of the precharge switch Eq and the bit line selector Se of the local bit line. Therefore, although the precharge switch Eq and the bit line selector Se are additionally introduced into a three-dimensional memory, it is unnecessary to additionally introduce control information and redundant decoding logic, thereby improving control efficiency and omitting a redundant component.

In still another embodiment of the present disclosure, an electronic device is further provided. The memory shown in FIG. 4 is included in the electronic device, a first chip and a second chip stacked in a third direction are included in the memory, and the first chip is connected to the second chip through bonding.

Referring to FIG. 1A, in the first chip, multiple sub array tiles sequentially arranged in a second direction are included in each memory array tile, multiple storage regions sequentially stacked in the third direction are included in each sub array tile, and two storage layer groups arranged in a first direction are included in each storage region. Multiple local bit lines are included in each storage layer group, one common bit line is separately disposed on two sides of each storage layer group in the first direction, each local bit line is coupled to the common bit line on one side through a respective bit line selector, and each local bit line is coupled to the common bit line on the other side through a respective precharge switch. Referring to FIG. 4, the bit line selector works based on the sub word line drive signal, and the precharge switch works based on the sub word line drive complementary signal. In this way, word line information is reused in this embodiment of the present disclosure to control working states of the precharge switch Eq and the bit line selector Se of the local bit line. Therefore, although the precharge switch Eq and the bit line selector Se are additionally introduced into a three-dimensional memory, it is unnecessary to additionally introduce control information and redundant decoding logic, thereby improving control efficiency and omitting a redundant component.

It should be noted that in this specification, the terms "include", "comprise", or any other variant thereof are intended to cover non-exclusive inclusion, so that a process, method, article, or apparatus including a series of elements includes not only those elements but also other elements that are not expressly listed, or further includes elements inherent to such a process, method, article, or apparatus. An element preceded by "includes a . . . " does not, without more constraints, preclude the presence of additional identical elements in the procedure, method, article, or apparatus including the element.

The sequence numbers of the foregoing embodiments of the present disclosure are merely for the purpose of description, and are not intended to indicate priorities of the embodiments. The methods disclosed in the several method embodiments provided in the present disclosure may be randomly combined when there is no conflict, to obtain new method embodiments. The features disclosed in the several product embodiments provided in the present disclosure may be randomly combined when there is no conflict, to obtain new product embodiments. The features disclosed in the several method or device embodiments provided in the present disclosure may be randomly combined when there is no conflict, to obtain new method embodiments or new device embodiments.

The foregoing descriptions are merely specific implementations of the present disclosure, but are not intended to limit the protection scope of the present disclosure. Any variation or replacement readily figured out by a person skilled in the art within the technical scope disclosed in the present disclosure shall fall within the protection scope of the present disclosure. Therefore, the protection scope of the present disclosure shall be subject to the protection scope of the claims.

The invention claimed is:

1. A memory, comprising a first chip, the first chip comprising a plurality of memory array tiles, each of the memory array tiles comprising a plurality of local bit lines and a plurality of common bit lines, the local bit lines extending in a first direction, the common bit lines extending in a second direction, one of the common bit lines existing on each of two sides of the local bit lines in the first direction, and the first direction intersecting the second direction;

each of the local bit lines being coupled to the common bit line on one side through a respective bit line selector, and each of the local bit lines being coupled to the common bit line on the other side through a respective precharge switch;

the bit line selector being configured to receive a sub word line drive signal, and selectively connect a connected local bit line to a connected common bit line based on the sub word line drive signal; and the precharge switch being configured to receive a sub word line drive complementary signal, and selectively connect a connected local bit line to a connected common bit line based on the sub word line drive complementary signal; and both the sub word line drive signal and the sub word line drive complementary signal being generated by decoding a row address signal in a command address signal received by the memory.

2. The memory according to claim 1, wherein each of the memory array tiles comprises a plurality of sub array tiles sequentially arranged in the second direction, each of the sub array tiles comprises a plurality of storage regions sequentially stacked in a third direction, and each of the storage regions comprises two storage layer groups arranged in the first direction; and a plurality of ones of the local bit lines are disposed in each of the storage layer groups, a first common bit line is disposed on an outer side of each of the storage layer groups away from the other one of the storage layer groups in a same one of the storage regions, and a second common bit line is disposed on an inner side of each of the storage layer groups close to the other one of the storage layer groups in a same one of the storage regions; and for each of the storage layer groups, each of the local bit lines is coupled to the second common bit line through the respective bit line selector, and each of the local bit lines is coupled to the first common bit line through the respective precharge switch.

3. The memory according to claim 1, wherein each of the memory array tiles comprises a plurality of sub array tiles sequentially arranged in the second direction, each of the sub array tiles comprises a plurality of storage regions sequentially stacked in a third direction, and each of the storage regions comprises two storage layer groups arranged in the first direction; and a plurality of ones of the local bit lines are disposed in each of the storage layer groups, a first common bit line is disposed on an outer side of each of the storage layer groups away from the other one of the storage layer groups in a same one of the storage regions, and a second common bit line is disposed on an inner side of each of the storage layer groups close to the other one of the storage layer groups in a same one of the storage regions;

the storage regions are numbered in the third direction for a same one of the sub array tiles;

for an odd-numbered one of the storage regions, each of the local bit lines is coupled to the first common bit line through the respective bit line selector, and each of the local bit lines is coupled to the second common bit line through the respective precharge switch; and for an even-numbered one of the storage regions, each of the local bit lines is coupled to the second common bit line through the respective bit line selector, and each of the local bit lines is coupled to the first common bit line through the respective precharge switch.

4. The memory according to claim 1, wherein the memory array tile further comprises a plurality of local word lines, and each of the local word lines runs through a plurality of stacked storage layer groups in the third direction; and the third direction is perpendicular to the first direction and perpendicular to the second direction;

one sub word line group is formed by a plurality of ones of the local word lines that are aligned in the first direction and that pass through a same one of the storage layer groups;

one of the local bit lines and one sub word line group have a correspondence, and a memory cell is formed at an intersection of the local bit line and each corresponding one of the local word lines; and all local word lines in a same sub word line group share a same sub word line drive signal and a same sub word line drive complementary signal, the bit line selector of the local bit line receives the sub word line drive signal of a corresponding sub word line group, and the precharge switch of the local bit line receives the sub word line drive complementary signal of the corresponding sub word line group.

5. The memory according to claim 4, wherein each of the memory array tiles further comprises a plurality of common word lines extending in the second direction; and the local word lines in each of the sub array tiles are numbered sequentially and independently, and identically numbered local word lines in different ones of the sub array tiles are electrically connected to a same one of the common word lines, and share a same sub word line drive signal and a same sub word line drive complementary signal.

6. The memory according to claim 5, wherein in the memory array tiles, the common word lines are sequentially numbered in the first direction, and N consecutively numbered ones of the common word lines form one main word line group;

the memory comprises a decoding unit and a plurality of sub word line driver units, wherein N is a positive integer;

the decoding unit is configured to decode the row address signal to generate a main word line drive signal, the sub word line drive signal, and the sub word line drive complementary signal that are of each of the common word lines;

the sub word line driver unit is coupled to one of the common word lines and is configured to: receive, and enable or disable the coupled common word line based on, a corresponding main word line drive signal, a corresponding sub word line drive signal, and a corresponding sub word line drive complementary signal; and the two storage layer groups in each of the storage regions are sequentially referred to as a first storage layer group and a second storage layer group in the first direction, the main word line drive signal is configured to select one main word line group from both the first storage layer group and the second storage layer group, and the sub word line drive signal and the sub word line drive complementary signal are configured to select one of the common word lines from the selected main word line group in the first storage layer group, or select one of the common word lines from the selected main word line group in the second storage layer group.

7. The memory according to claim 6, wherein the sub word line driver unit comprises a first switching transistor, a second switching transistor, and a third switching transistor; and control terminals of both the first switching transistor and the second switching transistor receive the main word line drive signal, a first terminal of the first switching transistor receives the sub word line drive signal, a second terminal of the first switching transistor, a first terminal of the second switching transistor, and a first terminal of the third switching transistor are all connected to the common word line, both a second terminal of the second switching transistor and a second terminal of the third switching transistor are connected to a power terminal, and a control terminal of the third switching transistor receives the sub word line drive complementary signal.

8. The memory according to claim 7, wherein the memory further comprises a second chip, the first chip and the second chip are stacked in the third direction, and the first chip is bonded to the second chip;

the second chip comprises a sense amplification region; and in the first chip, a stair contact structure is disposed between two of the storage layer groups adjacent in the first direction, and the common bit line directly connected to the bit line selector is coupled to the sense amplification region through the stair contact structure.

9. An electronic device, comprising the memory according to claim 1.

10. A control method for a memory, a first chip in the memory comprising a plurality of memory array tiles, each of the memory array tiles comprising a plurality of local bit lines and a plurality of common bit lines, each of the local bit lines being coupled to a common bit line on one side through a bit line selector, and each of the local bit lines being coupled to a common bit line on the other side through a respective precharge switch;

the method comprising:

receiving a command address signal, and decoding a row address signal in the command address signal to generate a plurality of main word line drive signals, a plurality of sub word line drive signals, and a plurality of sub word line drive complementary signals;

controlling, based on each of the sub word line drive signals, whether a corresponding bit line selector is to connect a connected local bit line to a connected common bit line; and controlling, based on each of the sub word line drive complementary signals, whether a corresponding precharge switch is to connect a connected local bit line to a connected common bit line.

11. The control method according to claim 10, wherein each of the memory array tiles comprises a plurality of sub array tiles sequentially arranged in a second direction, each of the sub array tiles comprises a plurality of storage regions sequentially stacked in a third direction, and each of the storage regions comprises two storage layer groups arranged in a first direction; and a plurality of ones of the local bit lines are disposed in each of the storage layer groups, and one of the common bit lines is separately disposed on two sides of each of the storage layer groups in the first direction;

the memory array tile further comprises a plurality of local word lines, and each of the local word lines runs through a plurality of stacked storage layer groups in the third direction; one sub word line group is formed by a plurality of ones of the local word lines that are aligned in the first direction and that pass through a same one of the storage layer groups, and all local word lines in a same sub word line group share a same sub word line drive signal and a same sub word line drive complementary signal; and one of the local bit lines and one sub word line group have a correspondence, and a memory cell is formed at an intersection of the local bit line and each corresponding one of the local word lines; and each sub word line group has a sub word line drive signal and a sub word line drive complementary signal; and the method further comprises:

transmitting the sub word line drive signal of the sub word line group to the bit line selector of the local bit line corresponding to the sub word line group; and transmitting the sub word line drive complementary signal of the sub word line group to the precharge switch of the local bit line corresponding to the sub word line group.

12. The control method according to claim 11, wherein the local word lines in each of the sub array tiles are numbered sequentially and independently, and identically numbered local word lines in different ones of the sub array tiles are electrically connected to a same common word line, and share a same sub word line drive signal and a same sub word line drive complementary signal; and in the memory array tiles, the common word lines are numbered in the first direction, and N consecutively numbered ones of the common word lines form one main word line group; and two storage layer groups in each of the storage regions are sequentially referred to as a first storage layer group and a second storage layer group in the first direction; and the method further comprises:

selecting one main word line group from both the first storage layer group and the second storage layer group based on the main word line drive signals;

selecting one of the common word lines from the selected main word line group in the first storage layer group or the selected main word line group in the second storage layer group based on the sub word line drive signal and the sub word line drive complementary signal; and enabling the selected common word line, and performing an operation indicated by the command address signal.

* * * * *